(12) United States Patent
Choi

(10) Patent No.: US 8,077,496 B2
(45) Date of Patent: Dec. 13, 2011

(54) NONVOLATILE MEMORY DEVICE AND METHOD OF DRIVING THE SAME

(75) Inventor: Byung-Gil Choi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 157 days.

(21) Appl. No.: 12/585,730

(22) Filed: Sep. 23, 2009

(65) Prior Publication Data
US 2010/0080040 A1    Apr. 1, 2010

(30) Foreign Application Priority Data

Sep. 26, 2008  (KR) .................. 10-2008-0094838

(51) Int. Cl.
*G11C 11/00* (2006.01)
(52) U.S. Cl. ...................... 365/148; 365/158
(58) Field of Classification Search .......... 365/148, 365/158
See application file for complete search history.

(56) References Cited

U.S. PATENT DOCUMENTS 6,862,213 B2    3/2005  Hamaguchi
7,436,693 B2 *  10/2008 Kang et al. .............. 365/148
2007/0058425 A1 * 3/2007 Cho et al. ................. 365/163

FOREIGN PATENT DOCUMENTS

| JP | 2006-155700 | 6/2006 |
| KR | 10-0764738 | 10/2007 |
| KR | 10-0801082 | 1/2008 |

* cited by examiner

*Primary Examiner* — Hoai V Ho
*Assistant Examiner* — Anthan Tran
(74) *Attorney, Agent, or Firm* — Harness, Dickey & Pierce, P.L.C.

(57) ABSTRACT

A nonvolatile memory and a method of driving the same are provided, which adopt an improved write verify operation. The method of driving a nonvolatile memory device having variable resistance memory cells, bit lines coupled to the variable resistance memory cells, and column selection transistors coupled between the variable resistance memory cells and the bit lines to receive a first control voltage being applied to their gates, includes making the first control voltage at a first level, and changing a resistance of the variable resistance memory cells by providing a write bias to the variable resistance cells; verifying and reading whether the changed resistance enters into a specified resistance window; and changing the first control voltage to a second level that is different from the first level, and changing the resistance of the variable resistance memory cells by providing the write bias to the variable resistance memory cells.

20 Claims, 9 Drawing Sheets

[ 1st PGM ]

[ 2nd PGM ]

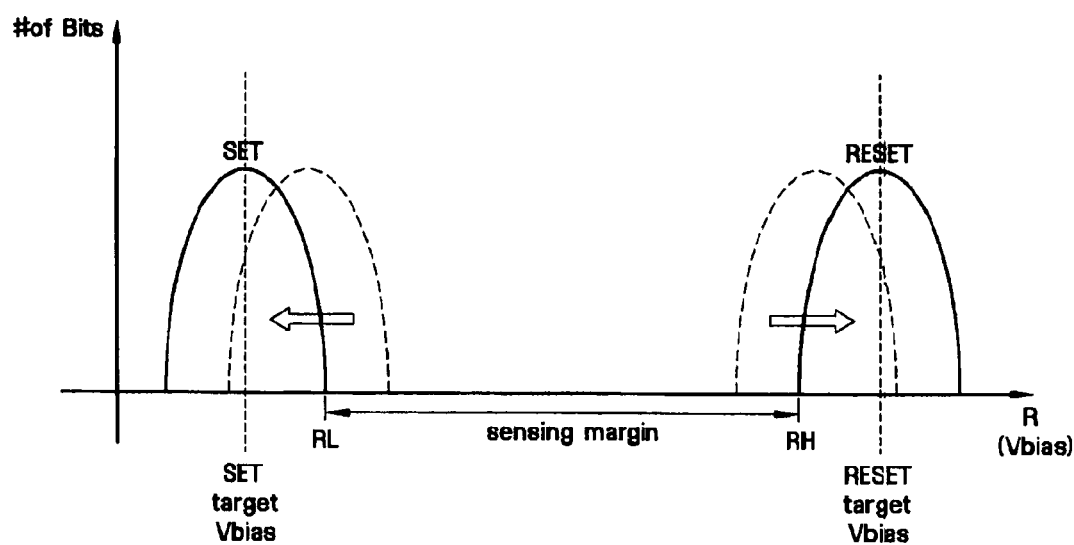

NONVOLATILE MEMORY DEVICE AND METHOD OF DRIVING THE SAME

FOREIGN PRIORITY STATEMENT

This application claims priority under 35 U.S.C. §119 to Korean Patent Application No. 10-2008-0094838, filed on Sep. 26, 2008 in the Korean Intellectual Property Office (KIPO), the entire contents of which are incorporated herein by reference.

BACKGROUND OF THE INVENTION

1. Field of the Invention

The present invention relates to a nonvolatile memory device and a method of driving the same, and more particularly, to a nonvolatile memory and a method of driving the same, which adopt an improved write verify operation.

2. Description of the Prior Art

A nonvolatile memory device using a resistance material includes a phase change random access memory (PRAM), a resistive RAM (RRAM), a magnetic RAM (MRAM), and the like. A dynamic RAM (DRAM) or a flash memory device stores data using charges, whereas the nonvolatile memory device using the resistance material stores data using a phase change of a phase change material such as a chalcogenide alloy (in the case of a PRAM), a resistance change of a variable resistance material (in the case of an RRAM), a resistance change of a magnetic tunnel junction (MTJ) thin film according to a magnetization state of a ferromagnetic material (in the case of an MRAM), and the like.

More specifically, the PRAM stores data using a phase change material such as a chalcogenide alloy of which the phase is changed to a crystalline state or an amorphous state as it is cooled after being heated. Since a phase change material in a crystalline state has a low resistance and a phase change material in an amorphous state has a high resistance, the crystalline state may be defined as a set state or a logic level "0", and the amorphous state may be defined as a reset state or a logic level "1".

The PRAM provides a set pulse or a reset pulse to the phase change material, and performs a write operation using joule heat generated according to the set pulse or the reset pulse provided to the phase change material. Specifically, the PRAM makes the phase change material in an amorphous state by heating the phase change material over its melting point using the reset pulse and then quickly cooling the melt phase change material, or makes the phase change material in a crystalline state by heating the phase change material to a temperature, which is higher than the crystalline temperature, but is lower than the melting point of the phase change material, and then cooling the phase change material after maintaining the temperature for a preset time.

In order to prevent unnecessary current consumption, the nonvolatile memory device using the resistance material including the phase change memory device may adopt a write verify operation. The write verify operation is performed in a manner that, before write data is written, data pre-stored in variable resistance memory cells (e.g. phase change memory cells in the case of a phase change memory device) is read (hereinafter referred to as verify data), the verify data and the write data are compared with each other, and the write data is written only in fail variable resistance memory cells in which the verify data and the write data are different from each other. When the write verify operation is performed, it is required that resistance values of variable resistance memory cells are arranged in specified resistance windows.

SUMMARY OF THE INVENTION

Accordingly, the present invention has been made to solve the above-mentioned problems occurring in the prior art, and an object of the present invention is to provide a nonvolatile memory that adopts an improved write verify operation.

Another object of the present invention is to provide a method of driving a nonvolatile memory that adopts an improved write verify operation.

Additional advantages, objects, and features of the invention will be set forth in part in the description which follows and in part will become apparent to those having ordinary skill in the art upon examination of the following or may be learned from practice of the invention.

In order to accomplish these objects, there is provided a nonvolatile memory device, according to the present invention, which includes a memory cell array including bit lines coupled to variable resistance memory cells, respectively, and column selection transistors coupled to the bit lines to receive a first control voltage being applied to their gates, respectively; a verification sense amplifier verifying and reading whether a resistance of the variable resistance memory cells enters into a specified resistance window; a control unit providing a control signal for changing a voltage level of the first control voltage in accordance with a result of verification; and a column decoder providing the first control voltage having at least one different voltage level based on the control signal to the column selection transistors.

In another aspect of the present invention, there is provided a method of driving a nonvolatile memory device including variable resistance memory cells, bit lines coupled to the variable resistance memory cells, respectively, and column selection transistors coupled between the variable resistance memory cells and the bit lines to receive a first control voltage being applied to their gates, respectively, which includes making the first control voltage at a first level, and changing a resistance of the variable resistance memory cells by providing a write bias to the variable resistance cells; verifying and reading whether the changed resistance enters into a specified resistance window; and changing the first control voltage to a second level that is different from the first level, and changing the resistance of the variable resistance memory cells by providing the write bias to the variable resistance memory cells.

In still another aspect of the present invention, there is provided a method of driving a nonvolatile memory device including variable resistance memory cells, bit lines coupled to the variable resistance memory cells, respectively, and column selection transistors coupled between the variable resistance memory cells and the bit lines to receive a first control voltage being applied to their gates, respectively, which includes, during a first write verify operation, writing write data by providing a write bias to the variable resistance memory cells; and during a second write verify operation, writing the write data by providing the write bias to the variable resistance memory cells. A level of the first control voltage in the first write verify operation is different from a level of the first control voltage in the second write verify operation.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

FIGS. 4A to 4C are views illustrating the resistance distribution of variable resistance memory cells included in a nonvolatile memory device in accordance with the voltage level of a first control voltage;

DETAILED DESCRIPTION OF THE PREFERRED EMBODIMENTS

Figure 1:
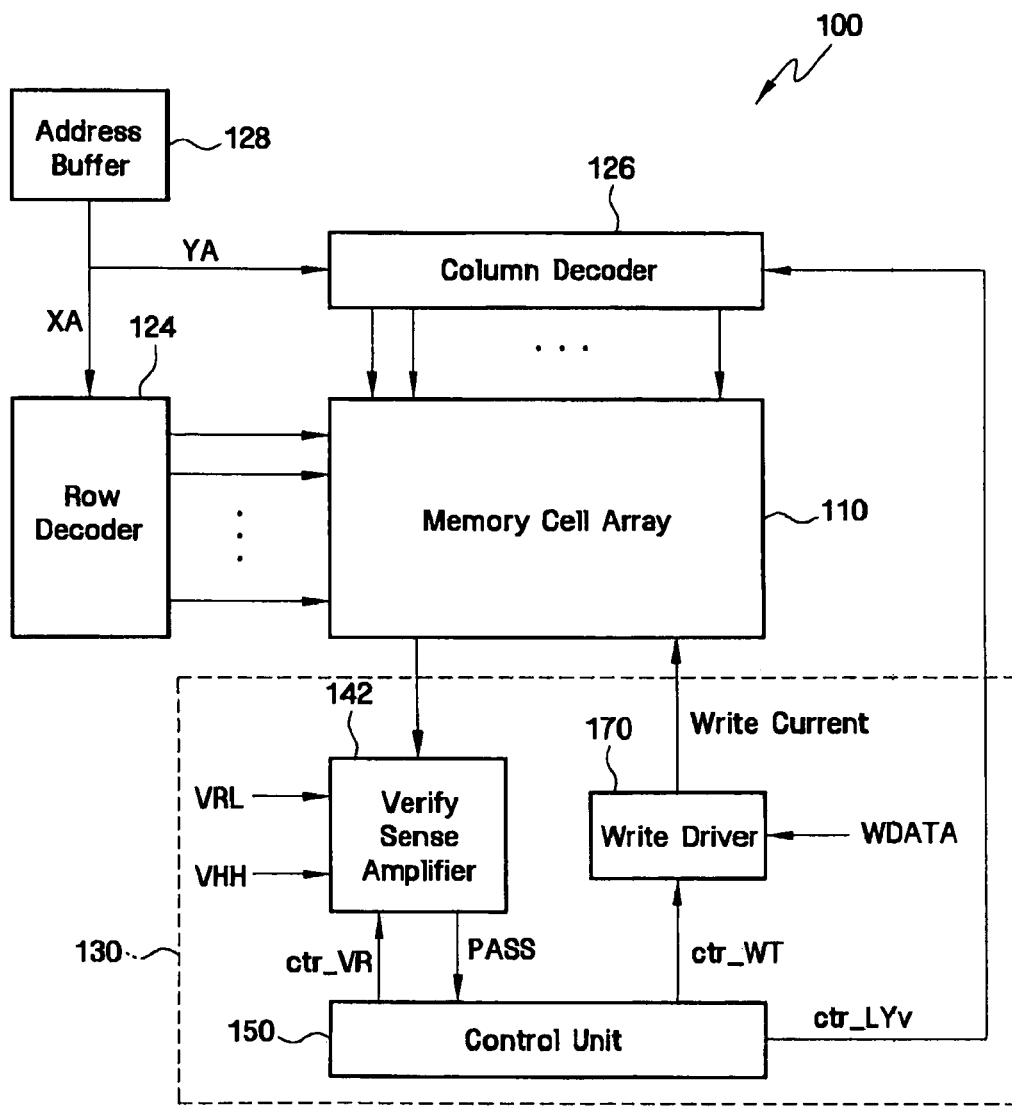
FIG. 1 is a block diagram explaining a nonvolatile memory device and a method of driving the same according to some embodiments of the present invention.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved. Unless specially defined, all terms (including technical and scientific terms) used in the description could be used as meanings commonly understood by those ordinary skilled in the art to which the present invention belongs. In addition, terms that are generally used but are not defined in the dictionary are not interpreted ideally or excessively unless they have been clearly and specially defined.

In the following description of the present invention, a resistive memory cell means a memory cell of a nonvolatile memory device using a resistance material, such as a phase change RAM (PRAM), a resistive RAM (RRAM), a ferroelectric RAM (FRAM), and the like. Although a PRAM has been described as an example, it will be apparent to those of ordinary skill in the art to which the present invention pertains that the present invention can also be applied to nonvolatile memories using other resistance materials.

Figure 3:
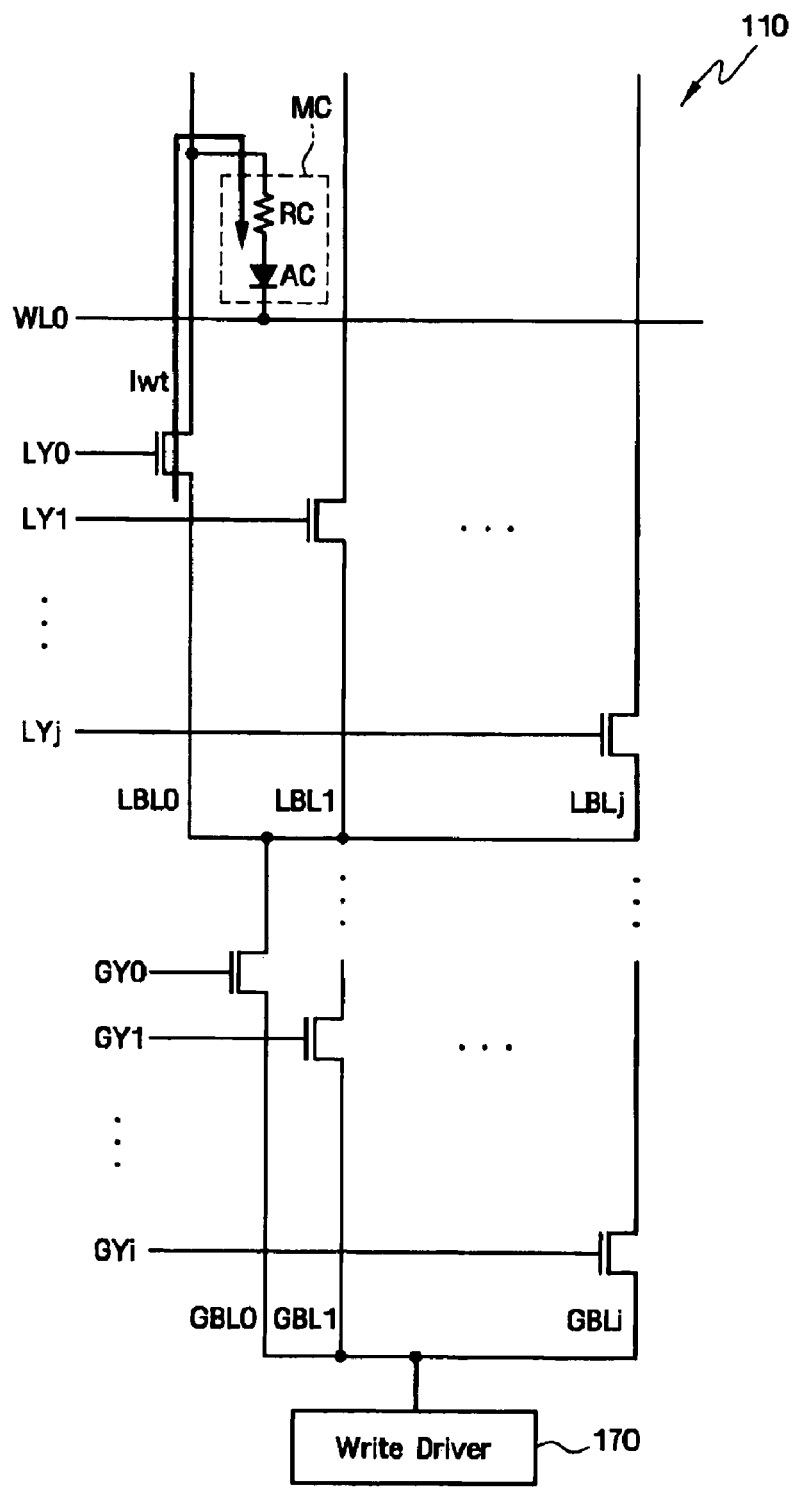
FIG. 3 is a circuit diagram explaining in detail a write verify operation in a nonvolatile memory device as illustrated in FIG. 1.

Also, in the description of the present invention, it is exemplified that the nonvolatile memory device includes local bit lines (See "LBL0" to "LBLj" in FIG. 3) and global bit lines (See "GBL0" to "GBLi" in FIG. 3). In the case where the nonvolatile memory device includes the local bit lines and the global bit lines, the bit lines used in the present invention may be the local bit lines, and column selection transistors coupled to the bit lines may be local column selection transistors coupled to the local bit lines. However, the present invention is not limited thereto. It will be apparent to those of ordinary skill in the art to which the present invention pertains that the present invention can be applied to not only a nonvolatile memory device including local bit lines and global bit lines but also a nonvolatile memory device including bit lines only.

Referring to FIGS. 1 to 5, a nonvolatile memory device and a method of driving the same according to a first embodiment of the present invention will be described. FIG. 1 is a block diagram explaining a nonvolatile memory device and a method of driving the same according to some embodiments of the present invention.

Referring to FIG. 1, a nonvolatile memory device 100 includes a memory cell array 110, an address buffer 128, a row decoder 124, a column decoder 126, and a write circuit 130.

The memory cell array 110 may include variable resistance memory cells (See "MC" in FIG. 3), local bit lines (See "LBL0" to "LBLj" in FIG. 3) coupled to the variable resistance memory cells, respectively, and local column selection transistors (See "LY0" to "LYj" in FIG. 3) coupled between the variable resistance memory cells and the local bit lines to receive a first control voltage being applied to their gates, respectively. The details of the memory cell array will be described later with reference to FIG. 3.

The row decoder 124 designates rows of at least one variable resistance memory cell to be written by receiving and decoding a row address XA from the address buffer 128. The column decoder 126 designates columns of at least one variable resistance memory cell to be written by receiving and decoding a column address YA from the address buffer 128. Also, the column decoder 126 may provide a first control voltage having at least one different voltage level to the column selection transistors based on a control signal ctr_LYv.

The write circuit 130 is coupled to global bit lines (See "GBL0" to "GBLi" in FIG. 3), and writes write data by providing a write bias to the variable resistance memory cell. In this case, the write operation can be performed through a plurality of successive write verify operations. Here, the write verify operation includes a write operation and a verify read operation to be described later. The write verify operation may be performed several times until the resistance of the variable resistance memory cell enters into a specified resistance window.

As illustrated in FIG. 1, the write circuit 130, for example, includes a write driver 170, a verify sense amplifier 142, and a control unit 150.

The write driver 170 provides a write bias to the global bit lines during a write period based on write data WDATA. In this case, the write bias is provided for at least one write loop. Specifically, the write driver 170 provides the write bias for each write loop in accordance with a control signal ctr_WT provided from the control unit 150. The number of write loops is determined by the control signal ctr_WT, and the write driver 170 provides the write bias to the global bit lines corresponding to the respective write loops. The write loop may be repeated at least once until the changed resistance of the variable resistance memory cell enters into the specified resistance window. The details of this feature will be described later with reference to FIGS. 3 to 5.

The verify sense amplifier 142 verifies and reads whether the resistance of the variable resistance memory cell enters into the specified resistance window. Particularly, as described later, the first control voltage that is provided to a gate of a local column selection transistor may have one or more different voltage levels, and whenever each step of the first control voltage is provided to the gate of the local column selection transistor, the verify sense amplifier 142 outputs a result of verification.

Specifically, the verify sense amplifier 142 receives reference voltages VRL and VRH corresponding to reference resistances (See "RL" and "RH" in FIG. 4C), and judges whether the resistance of the variable resistance memory cell enters into the specified resistance window by using the reference resistances VRL and VRH. If the write data WDATA is set data, the verify sense amplifier 142 judges whether the resistance level of the variable resistance memory cell enters into the resistance window corresponding to the set data by using the reference voltage VRL, while if the write data WDATA is reset data, it judges whether the resistance level of the variable resistance memory cell enters into the resistance window corresponding to the reset data by using the reference voltage VRH. Then, the verify sense amplifier 142 provides a pass signal PASS to the control unit 150 as a result of judgment. For example, a high-level pass signal PASS may be a signal indicating that the resistance level of the variable resistance memory cell has entered into the specified resistance window, and a low-level pass signal PASS may be a signal indicating that the resistance level of the variable resistance memory cell is not in the specified resistance window.

The control unit 150 outputs control signals ctr_LYv, ctr_WT, and ctr_VR in accordance with the result of verification from the verify sense amplifier 142. The control signal ctr_LYv is a signal that changes the voltage level of the first control voltage being applied to the gate of the column selection transistor, and may be provided in the column decoder 126. The control signal ctr_WT is a signal for controlling the operation of the write driver, and may be provided in the write driver 170. Also, the control signal ctr_VR is a signal for controlling the verify read operation of the verify sense amplifier 142, and may be provided in the verify sense amplifier 142.

Hereinafter, the operation of the control unit 150 will be described in more detail under the assumption that the high level pass signal PASS is a signal for reporting that the resistance level of the variable resistance memory cell has entered into the resistance window.

If the pass signal PASS is at a high level, the control unit 150 may output the control signal ctr_LYv for causing the voltage level of the first control voltage not to be changed any more, the control signal ctr_WT for causing the write loop not to be created any more, and the control signal ctr_VR for causing the verify read not to be performed any more. That is, if the pass signal PASS is at a high level, the control unit 150 may output control signals ctr_LYv, ctr_WT, and ctr_VR for terminating the write operation.

If the pass signal PASS is at a low level, the control unit 150 may output the control signal ctr_LYv for heightening or lowering the voltage level of the first control voltage, the control signal ctr_WT for generating a new write loop for applying the first control voltage of which the voltage level has been changed by the control signal ctr_LYv, and the control signal ctr_VR for indicating the verify read in the new write loop.

By the operation of the control unit 150 as described above, the write verify operation that includes the write operation and the verify read operation can be performed several times until the resistance of the variable resistance memory cell enters into the specified resistance window.

Figure 2:
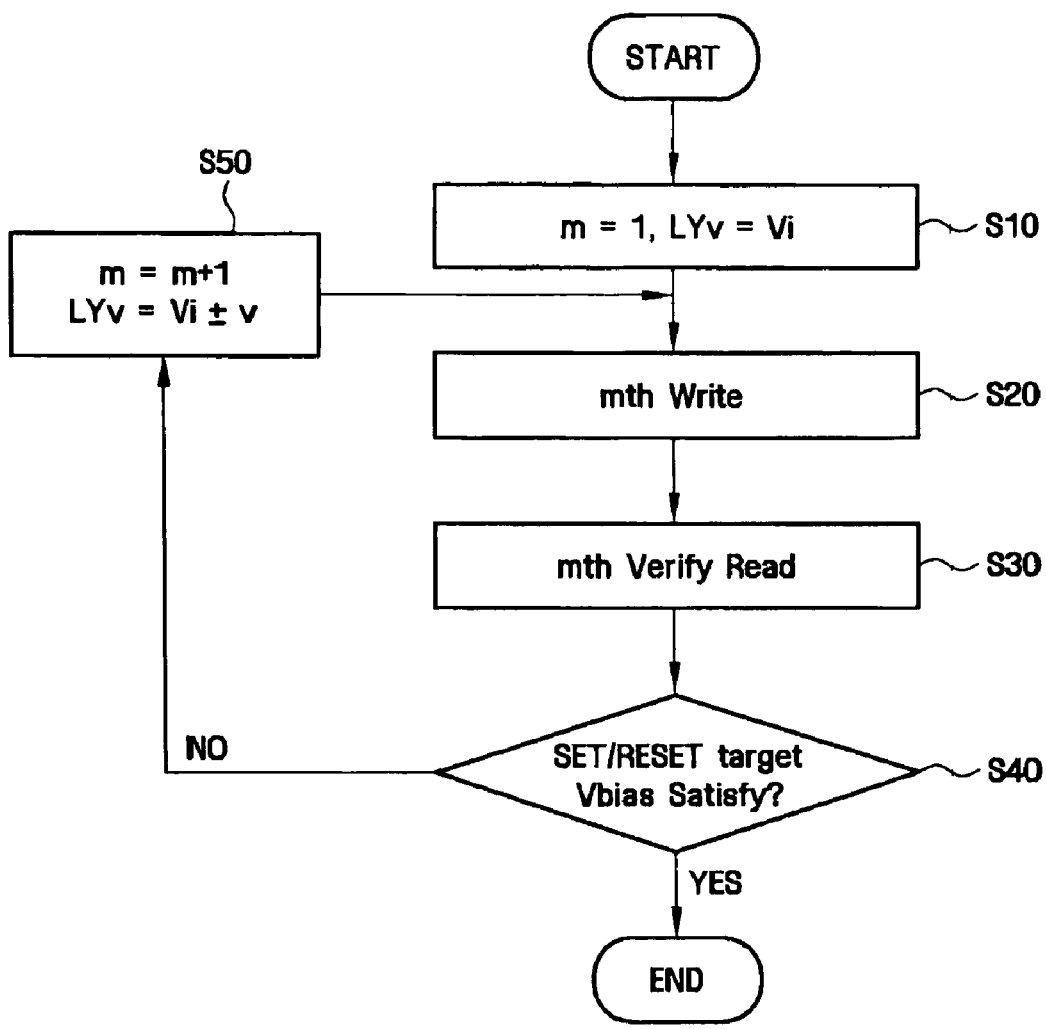
FIG. 2 is an exemplary flowchart explaining a method of driving a nonvolatile memory device as illustrated in FIG. 1.

FIG. 2 is an exemplary flowchart explaining a method of driving a nonvolatile memory device as illustrated in FIG. 1. In FIG. 2, "m" indicates the order of the write loop. For example, if m is "1", it means the first write loop, while if m is "2", it means the second write loop.

Referring to FIGS. 1 and 2, in step S10, in the first write loop (i.e. m is "1"), the first control voltage LYv has an initial voltage level Vi.

Then, in step S20, in the first write loop, the first control voltage LYv having the initial voltage level V1 is applied to the gate of the column selection transistor, and the write data WDATA is written in the variable resistance memory cell. By this write operation, the resistance of the variable resistance memory cell is changed.

Then, in step S30, it is verified and read whether the changed resistance of the variable resistance memory cell enters into the specified resistance window.

Then, in step S40, it is judged whether the result of the verify read operation in step S30 indicates that the set/reset target bias voltage has been satisfied. The set/reset target bias voltage corresponds to the resistance window corresponding to set data and the resistance window corresponding to reset data. That is, the case that the result of the verify read satisfies the set/reset target bias voltage means that the changed resistance of the variable resistance memory cell has entered into the specified resistance window. If the result of the verify read satisfies the set/reset target bias voltage, the write operation is ended.

By contrast, if the result of the verify read does not satisfy the set/reset target bias voltage, in step S50, the voltage level of the first control voltage LYv is changed in the second write loop (i.e. m is "2"). In the second write loop, the voltage level of the first control voltage LYv may have a value obtained by adding/subtracting a specified value to/from the initial voltage level Vi.

In the second write loop, the first control voltage LYv having the changed voltage level is applied to the gate of the column selection transistor, and the write data WDATA is written in the variable resistance memory cell in step S20. At this time, even if the same write data WDATA as that in the first write loop is written (i.e. even if the write bias having the same voltage level is provided from the write driver 170), the resistance of the variable resistance memory cell is changed since the voltage level of the first control voltage LYv has been changed. This feature will be described in more detail with reference to FIGS. 3 to 5.

Then, the verify read operation is performed S30, and it is judged whether the result of the verify read satisfies the set/reset target bias voltage S40. If the result of the verify read satisfies the set/reset target bias voltage, the write operation is ended, while otherwise, the voltage level of the first control voltage LYv is changed again in the third write loop (i.e. m is "3").

The heightening/lowering of the voltage level of the first control voltage S50, the m-th write operation S20, and the verify read operation S30 are repeated until the result of the verify read operation satisfies the set/reset target bias voltage. That is, the write verify operation including the write operation and the verify read operation is performed several times until the resistance of the variable resistance memory cell enters into the specified resistance window.

Figure 4A:
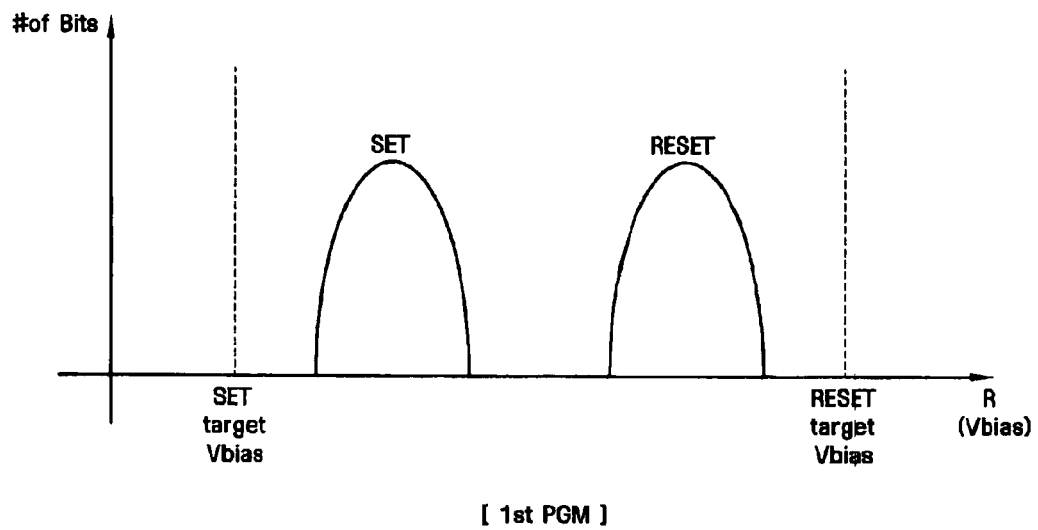
Figure 4B:
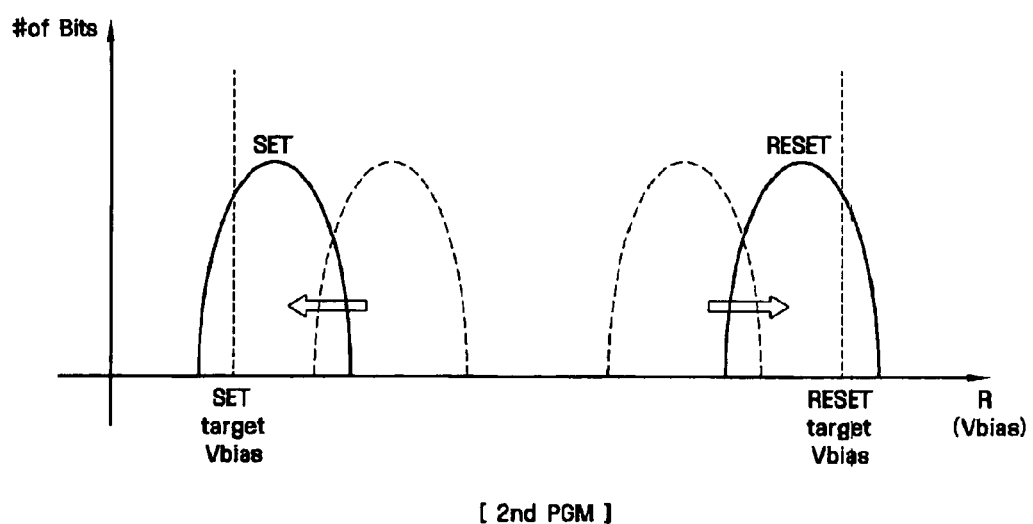
Figure 5:
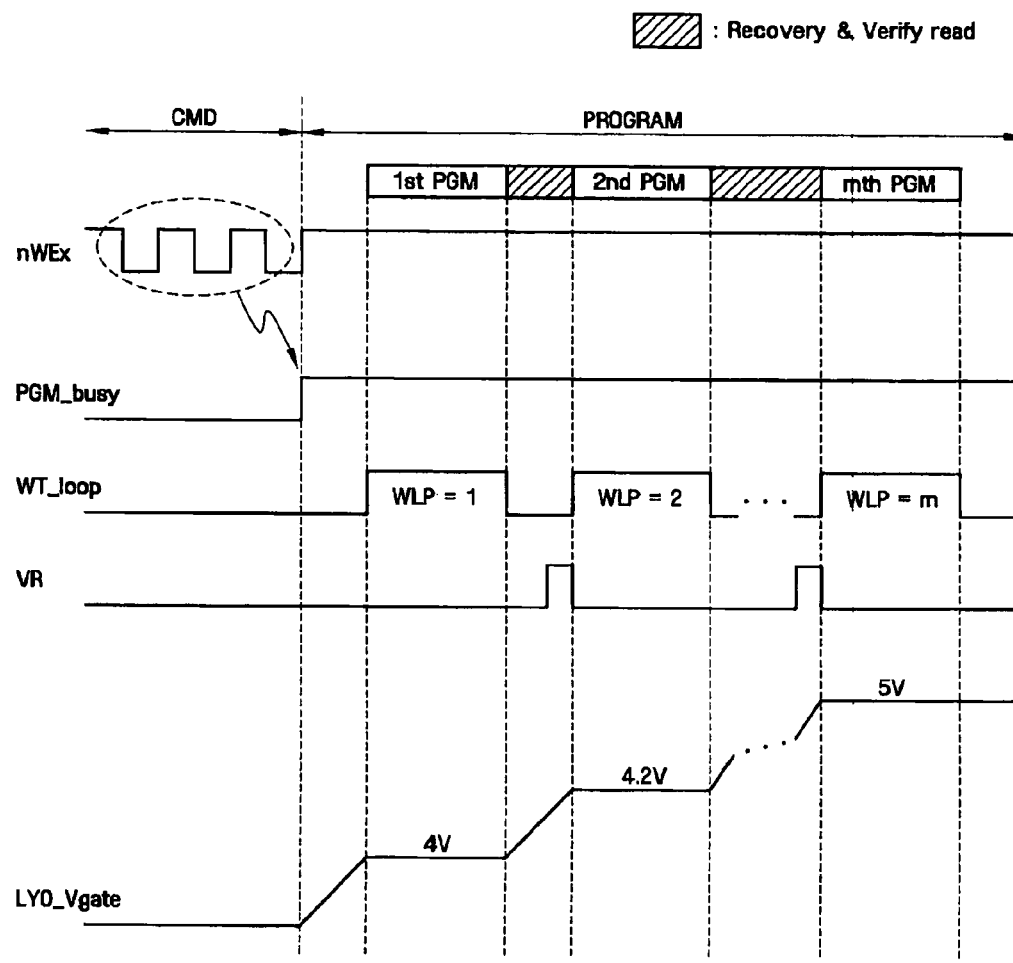
FIG. 5 is a timing diagram explaining the operation of the circuit as illustrated in FIG. 3.

Referring to FIGS. 3 to 5, the write verify operation of the nonvolatile memory device as illustrated in FIG. 1 will be described in detail.

FIG. 3 is a circuit diagram explaining in detail a write verify operation in a nonvolatile memory device as illustrated in FIG. 1. FIGS. 4A to 4C are views illustrating the resistance distribution of variable resistance memory cells included in a nonvolatile memory device in accordance with the voltage level of a first control voltage. FIG. 5 is a timing diagram explaining the operation of the circuit as illustrated in FIG. 3.

Referring to FIG. 3, the memory cell array 10 includes a plurality of variable resistance memory cells MC arranged in a matrix form. For convenience in explanation, FIG. 3 illustrates only one variable resistance memory cell MC. The plurality of variable resistance memory cells are coupled between word lines WL0~WLm (in FIG. 3, only "WL0" is illustrated) and local bit lines LBL0~LBLj, respectively.

The variable resistance memory cell MC includes a variable resistance element RC having a different resistance level in accordance with data stored in the memory cell, and an access element AC controlling current flowing through the variable resistance element RC. For example, as illustrated in FIG. 4C, the variable resistance element RC of the nonvolatile memory cell MC that can store one bit therein may have two resistance windows corresponding to set data and reset data. The resistance level of the resistance window, as illustrated in FIG. 4C, may be increased in the order of the set data and reset data. Also, the access element AC may be a diode, a transistor, or the like, coupled to the variable resistance element RC in series. In the drawing, a diode is illustrated as the access element AC.

According to the present invention, the local column selection transistors LY0 to LYj coupled to the local bit lines LBL0~LBLn may be, but are not limited to, nMOS transistors. The local column selection transistors LY0 to LYj may be certain elements through which current flows in proportion to the level of the first control voltage being applied to their gates.

In FIG. 3, the local bit lines LBL0~LBLj and the global bit lines GBL0~GBLi are illustrated. The global bit lines may be coupled to the local bit lines LBL0~LBLj. For convenience in explanation, only the local bit lines LBL0~LBLj coupled to the global bit line GBL0 are illustrated in FIG. 3. In the case where the nonvolatile memory device includes the local bit lines LBL0~LBLj and the global bit lines GBL0~GBLi as described above, it may also include global column selection switching elements GY0 to GYi coupled between the local bit lines LBL0~LBLj and the global bit lines GBL0~GBLi. The global column selection switching elements GY0 to GYi selectively connect the local bit lines LBL0~LBLj and the global bit lines GBL0~GBLi in accordance with the second control voltage being applied to the global column selection switching elements. The global column selection switching elements GY0 to GYi may be MOSFETs, and particularly, CMOSFETs.

With reference to FIGS. 3 to 5, the write operation of the circuit as illustrated in FIG. 3 will be described. The write data (See "WDATA" in FIG. 1) is written in the resistive memory cell MC coupled between a word line WL0 and the local bit line LBL0. In FIG. 5, "LY0_V gate" denotes the first control voltage being applied to the gate of the local column selection transistor LY0.

First, as a high level and a low level of a write enable signal nWEx are alternately repeated several times in a command period as illustrated in FIG. 5, a program activation signal PGM_busy goes to a high level, and a program period PROGRAM starts.

The program period PROGRAM may include at least one write loop (WLP=1~m). In FIG. 5, the respective write loops (WLP=1~m) refer to periods in which the write loop signal WT_loop is at a high level. In the respective write loops (WLP=1~m), the first write to the mth write (i.e. the first PGM to the mth PGM) are executed. In the respective write loops (WLP=1~m), write current flows to the selected resistive memory cell MC through the global bit line GBL0 and the local bit line LBL0 by a write bias provided from the write driver 170.

In FIG. 5, the respective write loops (WLP=1~m) may correspond to the respective voltage levels of the first control voltage LY0_V gate). That is, respective steps of the first control voltage LY0_V gate having different voltage levels may correspond to the respective write loops (WLP=1~m). At this time, the resistance level of the resistive memory cell MC may differ in accordance with the voltage level of the first control voltage LY0_V gate).

Under the assumption that the local column selection transistor LY0 is an nMOS transistor, the turn-on current of the local column selection transistor LY0 becomes large in proportion to the level of the first control voltage LY0_V gate being applied to its gate in a linear region. Accordingly, the write current Iwt may become large in proportion to the level of the first control voltage LY0_V gate, and thus the resistance level of the resistive memory cell MC may become high. That is, the resistance level RC of the variable resistance memory cell MC may substantially be in proportion to the voltage level of the first control voltage LY0_V gate.

To follow the respective write loops (WLP=1~m), recovery and verify read are executed. The verify read is a process of confirming whether the resistance levels changed by the first write to the mth write (i.e. the first PGM to the mth PGM) enter into the specified resistance window. For an accurate read operation, the verify read operation starts when a specified amount of time elapses after the data write, and this specified time amount of is called recovery. If the verify read signal VR goes to a high level after the recovery, the verify read operation starts.

In FIG. 5, the write loops (WLP=1~m), for which the write bias is provided, may be repeated at least once until the resistances changed by the first write to the mth write (i.e. the first PGM to the mth PGM) enter into the specified resistance window. For the respective write loops (WLP=1~m), the first control voltage LY0_V gate having a different voltage level may be applied. In other words, the verify read and the heightening/lowering of the voltage level of the first control voltage LY0_V gate may be repeated until the changed resistance enters into the specified resistance window.

This feature will be described in more detail with reference to FIGS. 3 to 5. FIGS. 4A to 4C are views illustrating the resistance distribution of the variable resistance memory cells grasp by the verify read after the respective write loops (WLP=1~m). In FIGS. 4A to 4C, the x-axis represents the resistance of the variable resistance memory cell, and the y-axis represents the number of variable resistance memory cells. In FIG. 5, a case that M=3 is exemplified, and FIGS. 4A, 4B, and 4C correspond to the first write (i.e. the first PGM), the second write (i.e. the second PGM), and the third write (i.e. the third PGM), respectively.

First, the first write verify is executed. Specifically, the resistance of the variable resistance memory cell MC is changed by applying the first control voltage having an initial voltage level (e.g. 4V) and providing the write bias to the variable resistance memory cell MC, and then the verify read is executed to confirm whether the changed resistance enters into the specified resistance window.

As a result of the verify read, as illustrated in FIG. 4A, it can be confirmed that the resistance of the variable resistance memory cell MC gets far apart from the set target bias and the reset target bias.

Then, the second write verify is executed. Specifically, the first control voltage LY0_V gate having the changed voltage level (e.g. 4.2V) is applied by changing the voltage level of the first control voltage LY0_V gate in accordance with the result of the first write verify operation, the resistance of the variable resistance memory cell MC is changed by providing the write bias to the variable resistance memory cell MC, and then the verify read is executed to confirm whether the changed resistance enters into the specified resistance window.

As a result of the verify read, as illustrated in FIG. 4B, it can be confirmed that, although the resistance distribution of the variable resistance memory cell MC is moved in a direction indicated by an arrow in FIG. 4B, the resistance of the variable resistance memory cell MC still gets somewhat apart from the set target bias and the reset target bias.

Then, the third write verify is executed. Specifically, the first control voltage LY0_V gate having the changed voltage level (e.g. 5V) is applied by changing the voltage level of the first control voltage LY0_V gate in accordance with the result of the second write verify operation, the resistance of the variable resistance memory cell MC is changed by providing the write bias to the variable resistance memory cell MC, and then the verify read is executed to confirm whether the changed resistance enters into the specified resistance window.

As a result of the verify read, as illustrated in FIG. 4C, it can be confirmed that the resistance distribution of the variable resistance memory cell MC is moved in a direction indicated by an arrow in FIG. 4C, and the resistance of the variable resistance memory cell MC satisfies the set target bias and the reset target bias. Accordingly, no further write verify operation is performed.

As described above, by repeating the resistance change of the variable resistance memory cell MC, which is performed by heightening/lowering the voltage level of the first control voltage LY0_V gate and providing the write bias, and the verify read, the resistance of the variable resistance memory cell MC can enter into the specified resistance window.

According to the first to third write verify operations as described above, the voltage level of the first control voltage LY0_V gate in the second write verify operation may be higher than that in the first write verify operation, and the voltage level of the first control voltage LY0_V gate in the third write verify operation may be higher than that in the second write verify operation. That is, the voltage level of the first control voltage LY0_V gate may be increased by stages from a low level to a high level as the write verify operation is repeated.

By contrast, in order to make the resistance of the variable resistance memory cell MC enter into the specified window, the voltage level of the first control voltage LY0_V gate may be decreased by stages from the high level to the low level as the write verify operation is repeated. On the other hand, in order to make the resistance of the variable resistance memory cell MC enter into the specified window, the increasing/decreasing of the voltage level of the first control voltage LY0_V gate may be alternately repeated as the write verify operation is repeated. However, in view of power consumption, it is favorable to make the resistance of the variable resistance memory cell MC enter into the specified resistance window by increasing the voltage level of the first control voltage LY0_V gate by stages from the low level to the high level as repeating the write verify operation.

According to the nonvolatile memory device and the method of driving the same according to the first embodiment of the present invention, the resistance level of the nonvolatile memory device is adjusted to have a desired resistance distribution by adopting an improved write verify operation, and thus a high-integration nonvolatile memory device can be easily developed.

Figure 6:
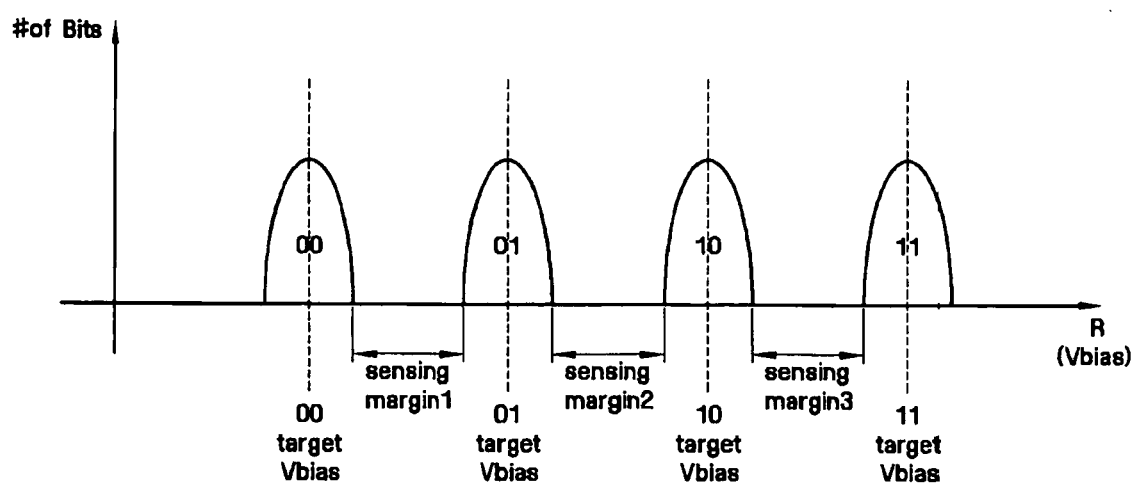
FIG. 6 is a view explaining the resistance of a variable resistance memory cell in a nonvolatile memory device and a method of driving the same according to a second embodiment of the present invention.

In the nonvolatile memory device and the method of driving the same according to the second embodiment of the present invention will be described with reference to FIG. 6. FIG. 6 is a view explaining the resistance of the variable resistance memory cell in a nonvolatile memory device and the method of driving the same according to the second embodiment of the present invention. The same reference numerals are used for constituent elements substantially the same as those in the first embodiment of the present invention, and for convenience in explanation, the substantially duplicate explanation thereof will be omitted.

In the nonvolatile memory device and the method of driving the same according to the first embodiment of the present invention, the resistive memory cell may store more than one bit. As described above, if more than one bit is stored in one resistive memory cell, the integrity of the nonvolatile memory device per unit area can be heightened. That is, much more bits can be stored in a limited wafer. A memory device including such resistive memory cells is called a multi-level nonvolatile memory device. For convenience in explanation, FIG. 6 illustrates that the variable resistance memory cell stores, but is not limited to store, two bits. For example, the variable resistance memory cell may store three bits, four bits, and the like.

In the case where the resistive memory cell is a two-bit cell that can store two bits, the respective resistive memory cells may have four different resistance levels in accordance with data being stored therein. The variable resistance element RC of the two-bit cell may have four resistance levels corresponding to data 00, data 01, data 10, and data 11, respectively. The resistance level may, for example, become higher in the order of data 00, data 01, data 10, and data 11 .

Referring to FIG. 6, each nonvolatile memory cell may store any one of data 00, data 01, data 10, and data 11, and the respective data correspond to different resistance windows. Also, the target bias voltage 00 corresponds to the resistance window corresponding to data 00, the target bias voltage 01 corresponds to the resistance window corresponding to data 01, the target bias voltage 10 corresponds to the resistance window corresponding to data 10, and the target bias voltage 11 corresponds to the resistance window corresponding to data 11 .

Referring to FIG. 6, sensing margins are arranged among the different resistance values. Specifically, the first sensing margin is arranged between the resistance window corresponding to data 00 and the resistance window corresponding to data 01, the second sensing margin is arranged between the resistance window corresponding to data 01 and the resistance window corresponding to data 10, and the third sensing margin is arranged between the resistance window corresponding to data 10 and the resistance window corresponding to data 11 .

In the same manner as the first embodiment of the present invention, the heightening/lowering of the voltage level of the first control voltage LV0_V gate, the changing of the resistance of the variable resistance memory cell by providing the write bias, and the verify read operation are repeated to make the resistance of the variable resistance memory cell MC enter into the specified resistance window. Specifically, in the case of writing data 00, data 01, data 10, and data 11 in the variable resistance memory cell MC, the resistance of the variable resistance memory cell MC may be set to fall into a resistance distribution that satisfies the target bias 00, the target bias 01, the target bias 10, and the target bias 11, respectively.

According to the nonvolatile memory device and the method for driving the same according to the second embodiment of the present invention, an improved write verify operation is employed, and the resistance level of the multi-level nonvolatile memory device is adjusted so as to have a desired distribution, so that the multi-level nonvolatile memory device can be easily developed.

Figure 7:
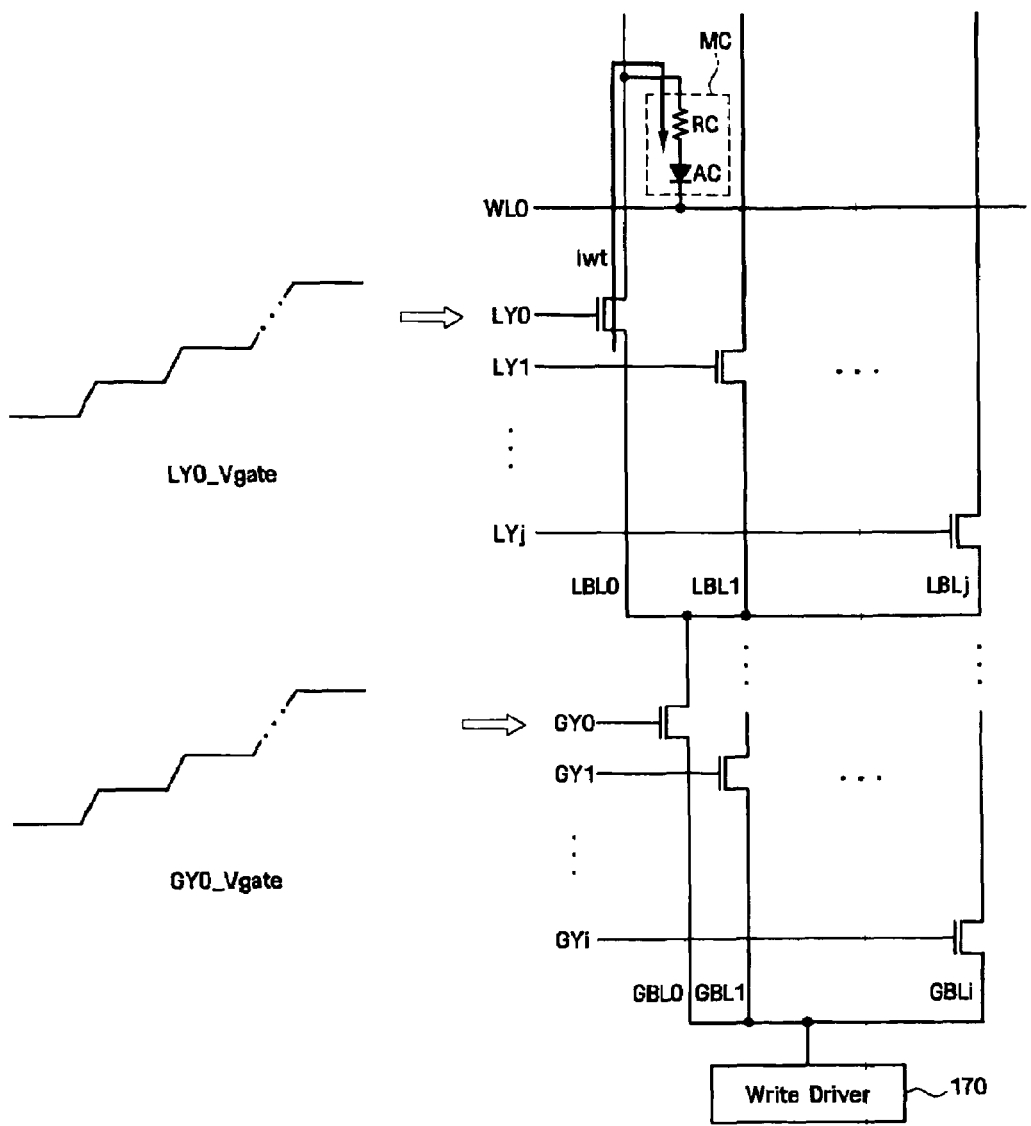
FIG. 7 is a circuit diagram explaining in detail a write verify operation in a nonvolatile memory device and a method of driving the same according to a third embodiment of the present invention.
Figure 8:
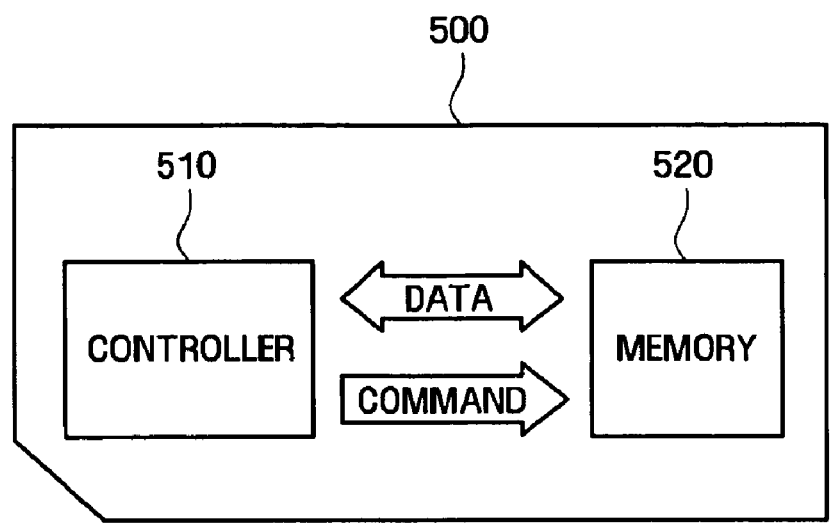
FIG. 8 is a schematic diagram roughly illustrating a memory card 500 according to example embodiments.
Figure 9:
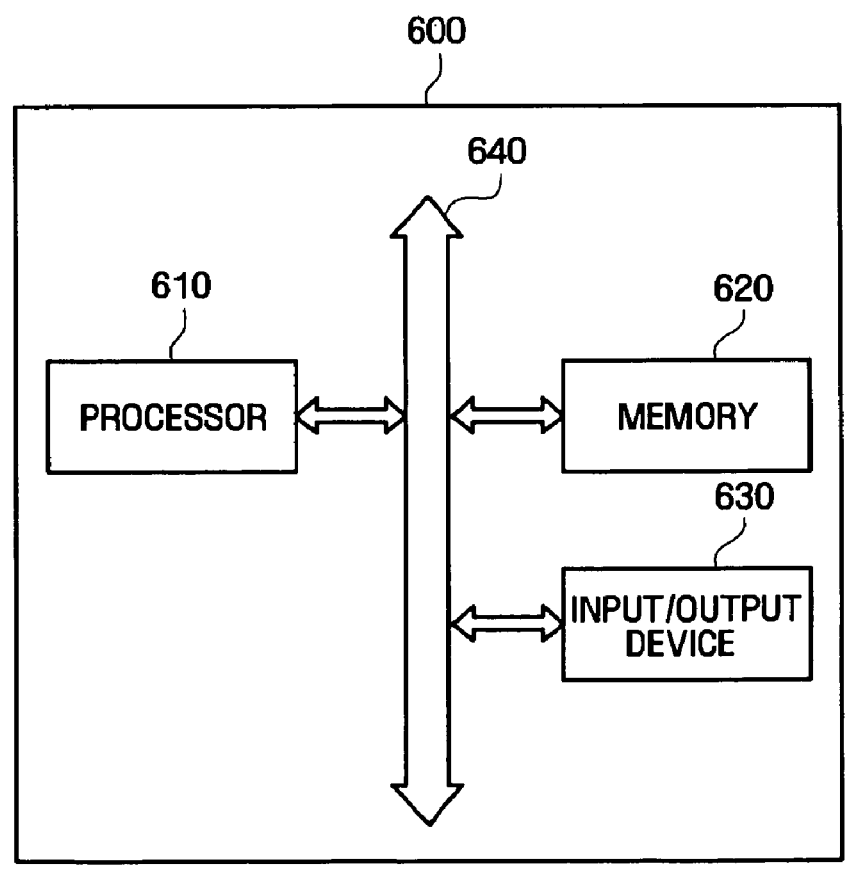
FIG. 9 is a block diagram roughly illustrating an electronic system 600 according to example embodiments.

Referring to FIG. 7, a nonvolatile memory device and a method for driving the same according to a third embodiment of the present invention will be described. FIG. 7 is a circuit diagram explaining in detail a write verify operation in a nonvolatile memory device and a method of driving the same according to a third embodiment of the present invention. The same reference numerals are used for constituent elements substantially the same as those in the first embodiment of the present invention, and for convenience in explanation, the substantially duplicate explanation thereof will be omitted.

Referring to FIG. 7, in the nonvolatile memory device and the method of driving the same according to the third embodiment of the present invention, changing the resistance of the variable resistance memory cell in accordance with the result of the write verify operation may further include changing the voltage level of the second control voltage being applied to the control terminal of the global column selection switching element in addition to changing the voltage level of the first control voltage being applied to the gate of the local column selection transistor. That is, the voltage level of the second control voltage being applied to the global column selection switching element may be set to differ from the previous voltage level. In other words, the level of the second control voltage in the first write verify operation may differ from the level of the second control voltage in the second write verify operation.

In this case, the global column selection switching element may be, but is not limited to, a MOSFET, and particularly, nMOSFET. Specifically, any element, of which the turn-on current flowing between both ends thereof is changed in accordance with the voltage level of the second control voltage being applied to the global column selection switching element, can be adopted as the global column selection switching element.

FIG. 20 is a schematic diagram illustrating a memory card 500 according to example embodiments. Referring to FIG. 20, a controller 510 and a memory 520 may exchange electric signals. For example, according to commands of the controller 510, the memory 520 and the controller 510 may exchange data. Accordingly, the memory card 500 may either store data in the memory 520 or output data from the memory 520. The memory 520 may include one of the non-volatile memory devices described above in reference to FIGS. 1 through 7.

Such a memory card 500 may be used as a storage medium for various portable electronic devices. For example, the memory card 500 may be a multimedia card (MMC) or a secure digital (SD) card.

FIG. 21 is a block diagram roughly illustrating an electronic system 600 according to example embodiments. Referring to FIG. 21, a processor 610, an input/output device 630, and a memory 620 may perform data communication with each other by using a bus 640. The processor 610 may execute a program and control the electronic system 600. The input/output device 630 may be used to input/output data to/from the electronic system 600. The electronic system 600 may be connected to an external device, e.g. a personal computer or a network, by using the input/output device 630 and may exchange data with the external device.

The memory 620 may store codes or programs for operations of the processor 610. For example, the memory 620 may include one of the non-volatile memory devices described above in reference to FIGS. 1 through 7.

For example, such an electronic system 600 may embody various electronic control systems requiring the memory 620, and, for example, may be used in mobile phones, MP3 players, navigation devices, solid state disks (SSD), or household appliances.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:
1. A method of driving a nonvolatile memory device including a plurality of variable resistance memory cells, each of the plurality of variable resistance memory cells having a bit line coupled to the variable resistance memory cell and a column selection transistor coupled between the variable resistance memory cell and the bit line to receive a first control voltage being applied to a gate of the column selection transistor, the method comprising:
    setting the first control voltage at a first level;
    changing a resistance of a selected memory cell from among the plurality of variable resistance memory cells by providing a write bias to the selected memory cell while setting the first control voltage;

determining whether the changed resistance of the selected memory cell enters into a desired resistance window;

changing, based on the determining step, the first control voltage to a second level that is different from the first level; and changing the resistance of the selected memory cells by providing the write bias to the selected memory cell while changing the first control voltage.

2. The method of claim 1, wherein the changing the first control voltage and the changing the resistance of the selected memory cell in accordance with the determining are repeated until the changed resistance enters into the desired resistance window.

3. The method of claim 2, wherein the second level is a level higher than the first level, and the changing the first control voltage is repeated so as to increase the voltage level of the first control voltage in stages from a low level to the high level.

4. The method of claim 3, wherein the write bias is provided during a write loop, and the write loop is repeated at least once until the changed resistances of the plurality of variable resistance memory cells enter into the desired resistance window.

5. The method of claim 4, wherein the stages of the voltage levels of the first control voltage increase with each repeating of the write loop.

6. The method of claim 1, wherein the plurality of variable resistance memory cells are two-bit cells.

7. The method of claim 1, wherein the bit line is a local bit line, and the column selection transistor is a local column selection transistor;

the nonvolatile memory device further comprises a global bit line coupled to the local bit line, and a global column selection switching element selectively connecting the local bit line and the global bit line; and the changing the resistance of the selected memory cell in accordance with the determining further comprises changing a voltage level of a second control voltage being applied to the global column selection switching element.

8. A method of driving a nonvolatile memory device including a plurality of variable resistance memory cells, each of the plurality of variable resistance memory cells having a bit line coupled to the variable resistance memory cell and column selection transistor coupled between the variable resistance memory cell and the bit lines to receive a first control voltage being applied to a gate of the column selection transistor, the method comprising:

during a first write verify operation, writing write data by providing a write bias to a selected memory cell from among the plurality variable resistance memory cells; and during a second write verify operation, writing the write data by providing the write bias to the selected variable resistance memory cell, wherein a level of the first control voltage in the first write verify operation is different from a level of the first control voltage in the second write verify operation.

9. The method of claim 8, wherein the second write verify operation is performed several times until a resistance of the selected memory cell enters into a desired resistance window.

10. The method of claim 8, wherein the level of the first control voltage in the second write verify operation is higher than the level of the first control voltage in the first write verify operation.

11. The method of claim 8, wherein the plurality of variable resistance memory cells are two-bit cells.

12. The method of claim 8, wherein the bit line is a local bit line, and the column selection transistor is a local column selection transistor;

the nonvolatile memory device further comprises a global bit line coupled to the local bit line, and global column selection switching element selectively connecting the local bit line and the global bit line, a second control voltage being applied to the global column selection switching element; and a level of the second control voltage in the first write verify operation is different from a level of the second control voltage in the second write verify operation.

13. A nonvolatile memory device comprising:

a plurality of variable resistance memory cells;

bit lines coupled to the plurality of variable resistance memory cells, respectively;

column selection transistors coupled between the plurality of variable resistance memory cells and the bit lines, respectively, each of the column selection transistors being configured to receive a first control voltage being applied to a gate of the column selection transistor; and a write circuit coupled to the bit lines configured perform a write operation by providing a write bias to a selected memory cell from among the plurality of variable resistance memory cells to write data, the write circuit being configured to perform the write operation through one or more successive write verify operations, wherein a level of the first control voltage in a previous write verify operation is different from a level of the first control voltage in a subsequent write verify operation.

14. The nonvolatile memory device of claim 13, wherein the write verify operation is performed several times until a resistance of the selected memory cell enters into a desired resistance window.

15. The nonvolatile memory device of claim 14, further comprising:

a verify sense amplifier configured to determine whether the resistance of the selected memory cell enters into the desired resistance window; and a control unit configured to provide a control signal for changing the level of the first control voltage in accordance with the result of verification.

16. The nonvolatile memory device of claim 13, wherein the level of the first control voltage in the subsequent write verify operation is higher than the level of the first control voltage in the previous write verify operation.

17. The nonvolatile memory device of claim 13, wherein the column selection transistor is an nMOS transistor, and a resistance level of the selected memory cell increases substantially in proportion to increases in the voltage level of the first control voltage.

18. The nonvolatile memory device of claim 13, wherein the plurality of variable resistance memory cells are two-bit cells.

19. The nonvolatile memory device of claim 13, wherein each of the plurality of variable resistance memory cells is one of a phase change random access memory (PRAM) cell and a resistive RAM (RRAM) cell.

20. The nonvolatile memory device of claim 13, wherein the bit lines are local bit lines, and the column selection transistors are local column selection transistors;

the nonvolatile memory device further comprises global bit lines coupled to the local bit lines, and global column selection switching elements configured to selectively connectithe local bit lines and the global bit lines, a second control voltage being applied to the global column selection switching elements; and a level of the second control voltage in the previous write verify operation is different from a level of the second control voltage in the subsequent write verify operation.

* * * * *